(12) United States Patent
Kim et al.

(10) Patent No.: US 8,653,393 B2
(45) Date of Patent: Feb. 18, 2014

(54) TOUCH SCREEN PANEL

(75) Inventors: Dongsup Kim, Seoul (KR); Byungkoo Kang, Paju-si (KR); Sohaeng Cho, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 241 days.

(21) Appl. No.: 13/242,633

(22) Filed: Sep. 23, 2011

(65) Prior Publication Data

US 2012/0080302 A1 Apr. 5, 2012

(30) Foreign Application Priority Data

Oct. 1, 2010 (KR) ........................ 10-2010-0096094

(51) Int. Cl.
*H03K 17/975* (2006.01)

(52) U.S. Cl.
USPC ...................................................... 200/600

(58) Field of Classification Search
USPC .......... 200/600, 46, 5 R, 292, 511–512, 11 D, 200/11 DA, 5 A
See application file for complete search history.

(56) References Cited

U.S. PATENT DOCUMENTS

| | | | |
|---|---|---|---|
| 7,864,503 B2 * | 1/2011 | Chang | 361/288 |
| 8,040,321 B2 * | 10/2011 | Peng et al. | 345/169 |
| 2009/0244021 A1 * | 10/2009 | Matsuo et al. | 345/173 |
| 2010/0328113 A1 * | 12/2010 | Henry et al. | 341/24 |
| 2011/0096005 A1 * | 4/2011 | Kim et al. | 345/173 |
| 2011/0102370 A1 * | 5/2011 | Kono et al. | 345/174 |
| 2012/0312677 A1 * | 12/2012 | Kuriki | 200/600 |

FOREIGN PATENT DOCUMENTS

KR 10-2009-0102663 A 9/2009
KR 10-2009-0122586 A 12/2009

* cited by examiner

*Primary Examiner* — Edwin A. Leon
*Assistant Examiner* — Anthony R. Jimenez
(74) *Attorney, Agent, or Firm* — Birch, Stewart, Kolasch & Birch, LLP

(57) ABSTRACT

A touch screen panel according to an embodiment includes a substrate; an electrode forming part formed on the substrate, the electrode forming part including a plurality of first electrode serials arranged in parallel in a first direction and a plurality of second electrode serials arranged in parallel in a second direction to cross over the plurality of first electrode serials; a routing wire forming part formed on the substrate outside the electrode forming part, the routing wire forming part including a plurality of first routing wires respectively connected to the plurality of first electrode serials and a plurality of second routing wires respectively connected to the plurality of second electrode serials; and an insulation layer configured to insulate the first electrode serial from the second electrode serial at each of intersections of the first electrode serials and the second electrode serials.

9 Claims, 5 Drawing Sheets

TOUCH SCREEN PANEL

This application claims the benefit of Korean Patent Application No. 10-2010-0096094 filed on Oct. 1, 2010, the entire contents of which is incorporated herein by reference for all purposes as if fully set forth herein.

BACKGROUND OF THE INVENTION

1. Field of the Invention

Embodiments of the invention relate to a touch screen panel.

2. Discussion of the Related Art

Along with the development of the electronics industry, display devices, such as a liquid crystal display, an electroluminescent display, and a plasma display panel, having a fast response time, low power consumption, and an excellent color reproduction rate, have been in the spotlight. The display devices are used for various electronic products such as televisions, monitors for computers, notebook computers, mobile telephones, display units for refrigerators, personal digital assistants, automated teller machines, and the like. In general, the display device interfaces with various input devices such as a keyboard, a mouse, and a digitizer. However, when a separate input device such as a keyboard, a mouse, or digitizer is used, user's dissatisfaction is increased because the user is required to know how to use the separate input device and the separate input device occupies space. Therefore, a convenient and simple input device that can reduce erroneous operation is needed. Also, there is a need for a touch screen panel in which the user can input information by directly contacting a screen with user's finger or a pen.

Because the touch screen panel has a simple configuration, which minimizes erroneous operations, the user can perform an input action without using a separate input device, and can quickly and easily manipulate through contents displayed on the screen. Accordingly, the touch screen panel has been applied to various display devices.

Touch screen panels are classified into a resistive type, a capacitive type, and an electromagnetic type based on a detection method of a touched portion. The resistive type touch screen panel determines a touched position by a voltage gradient based on changes of resistance in a state where a DC voltage is applied to metal electrodes formed on an upper plate or a lower plate. The capacitive type touch screen panel senses a touched position based on changes in capacitance generated in an upper or lower plate when the user physically contacts with a conductive film formed on the upper or lower plate. The electromagnetic type touch screen panel detects a touched portion by reading an LC value induced as an electromagnetic pen touches a conductive film.

Hereinafter, a related art capacitive type touch screen panel will be described with reference to FIG. 1. FIG. 1 is a plan view of a related art capacitive type touch screen panel.

As shown in FIG. 1, the related art capacitive type touch screen panel includes an electrode forming part A, a routing wire forming part B, and a pad forming part C.

The electrode forming part A is formed on a substrate 10. The electrode forming part A includes a plurality of first electrodes 21 arranged in parallel in a first direction (for example, X-axis direction) and a plurality of second electrodes 22 arranged in a second direction (for example, Y-axis direction) perpendicular to the first direction to cross over the first electrodes 21. Although the first electrodes 21 and the second electrodes 22 cross over each other, they are kept electrically insulated by an insulation layer (not shown). Moreover, the adjacent first electrodes 21 are separated from each other, but are connected to each other by bridges 41, thereby forming first channels in a row direction. Namely, the bridges 41 connect the adjacent first electrodes 21 to each other through contact holes 30a and 30b formed in the insulation layer (not shown) covered on the top of the first and second electrodes 21 and 22, whereby the first channels each having the first electrodes 21 connected together are formed in the row direction. Further, the second electrodes 22 are integrally formed, thereby forming second channels crossing over the first channels in a column direction.

The routing wire forming part B is formed outside the electrode forming part A. The routing wire forming part B includes a plurality of first routing wires 42 respectively connected to the plurality of first electrodes 21 and a plurality of second routing wires 43 respectively connected to the plurality of second electrodes 22.

The pad forming part C includes a plurality of first pads 61 respectively connected to the plurality of first electrodes 21 through the plurality of first routing wires 42 and a plurality of second pads 62 respectively connected to the plurality of second electrodes 22 through the plurality of second routing wires 43.

In the capacitive type touch screen panel having the above-described configuration, it is necessary to test whether or not the first channel of the row direction and the second channel of the column direction are shorted to each other or whether or not each of the first channel and the second channel is opened. This test is referred to as a channel open/short test. The channel open/short test generally includes an array test conducted after the touch screen panel is manufactured and an image test conducted after the touch screen panel is applied to the display device. A test equipment is used to conduct the channel open/short test. However, because the test equipment may cause static electricity, a countermeasure for preventing the static electricity is necessary.

In order to preventing the static electricity, it is necessary to incorporate a separate antistatic circuit into the touch screen panel. Accordingly, an additional process has to be performed so as to form the antistatic circuit, and a space to form the antistatic circuit is necessary. Furthermore, when the array test and/or the image test are conducted using the first and second pads 61 and 62 of the pad forming part C, it is decided whether or not each of the first and second channels is normal by contacting a signal supplying pin for supplying a signal with each of the first and second pads 61 and 62 respectively corresponding to the first and second channels, and then contacting a signal receiving pin with each of the first and second pads which is contacted with the signal application pin. However, because the above-described process for the channel open/short test has to be performed on each of the first and second channels, much time is consumed. As a result, a tact time (indicating a time required to manufacture a unit product so as to meet its daily production target) increases, and the manufacturing yield is reduced.

SUMMARY OF THE INVENTION

Embodiments of the invention provide a touch screen panel capable of preventing static electricity, which may be generated in a channel open/short test, reducing a tact time by quickly conducting the channel open/short test of first and second channels, and increasing productivity.

In one aspect, there is a touch screen panel comprising a substrate; an electrode forming part formed on the substrate, the electrode forming part including a plurality of first electrode serials arranged in parallel in a first direction and a plurality of second electrode serials arranged in parallel in a second direction to cross over the plurality of first electrode serials; a routing wire forming part formed on the substrate outside the electrode forming part, the routing wire forming part including a plurality of first routing wires respectively connected to the plurality of first electrode serials and a plurality of second routing wires respectively connected to the plurality of second electrode serials; and an insulation layer configured to insulate the first electrode serial from the second electrode serial at each of intersections of the first electrode serials and the second electrode serials, wherein the plurality of first routing wires are formed along a first side of the electrode forming part, and the plurality of second routing wires are formed along a second side of the electrode forming part, wherein each of the plurality of first electrode serials includes a plurality of first electrode patterns, that are electrically connected to one another, and each of the plurality of second electrode serials includes a plurality of second electrode patterns, that are electrically connected to one another, wherein each of the first electrode patterns formed at a third side of the electrode forming part includes a first extension pattern extending to the outside of the electrode forming part, and each of the second electrode patterns formed at a fourth side of the electrode forming part includes a second extension pattern extending to the outside of the electrode forming part.

The first and second sides of the electrode forming part are adjacent to each other and connected to each other, the third and fourth sides of the electrode forming part are adjacent to each other and connected to each other, and the first and third sides of the electrode forming part are face to face.

The first extension pattern includes a first extension portion extending with the same width as the first electrode pattern, a second extension portion, which has a width less than a width of the first extension portion and extends from the first extension portion to the outside of the electrode forming part, and a third extension portion, which has a width greater than the width of the second extension portion and less than the width of the first extension portion and extends from the second extension portion to the outside of the electrode forming part.

The second extension pattern includes a first extension portion extending with the same width as the second electrode pattern, a second extension portion, which has a width less than a width of the first extension portion and extends from the first extension portion to the outside of the electrode forming part, and a third extension portion, which has a width less than the width of the second extension portion and extends from the second extension to the outside of the electrode forming part The touch screen panel further comprises a plurality of first pads respectively connected to the plurality of first routing wires and a plurality of second pads respectively connected to the plurality of second routing wires. Further, the touch screen panel further comprises a shorting bar configured to short the plurality of first pads and the plurality of second pads and a shorting pad connected to the shorting bar.

The touch screen panel further comprises a pair of first alignment keys, which are spaced apart from the first extension patterns formed at both ends of the third side of the electrode forming part at a predetermined distance, respectively. The touch screen panel further comprises a pair of second alignment keys, which are spaced apart from the second extension patterns formed at both ends of the fourth side of the electrode forming part at a predetermined distance, respectively.

The first extension patterns and the second extension patterns have at least one of a circle shape, an oval shape, a triangle shape, a rectangle shape, a diamond shape, and a polygon shape.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the preferred embodiments of the present invention, examples of which are illustrated in the accompanying drawings. The same reference signs are used to indicate the same components throughout the specification.

Figure 1:
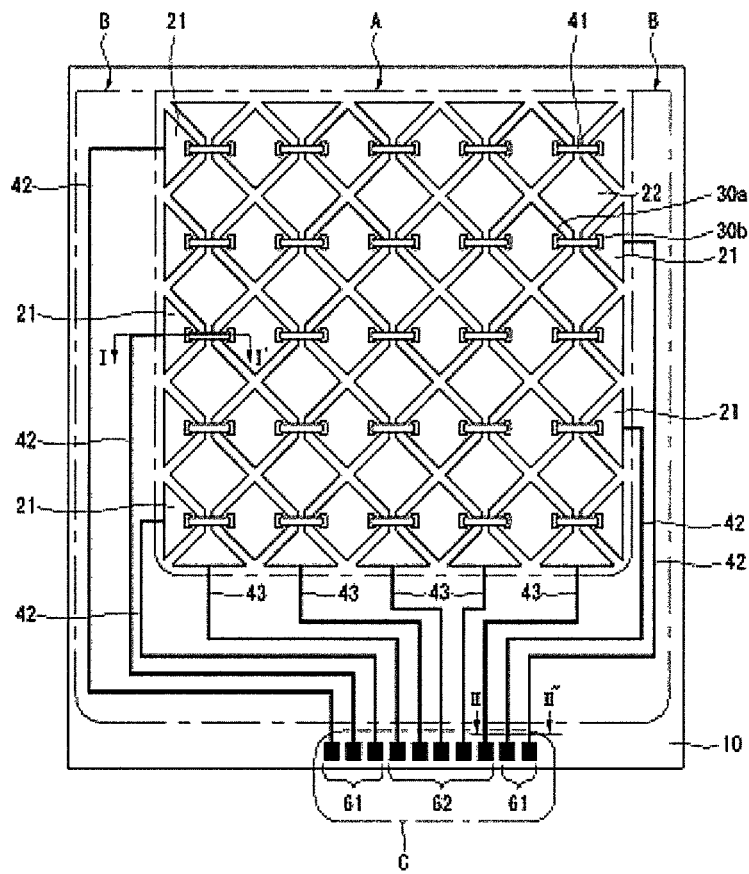
FIG. 1 is a plan view of a related art capacitive type touch screen panel.
Figure 2:
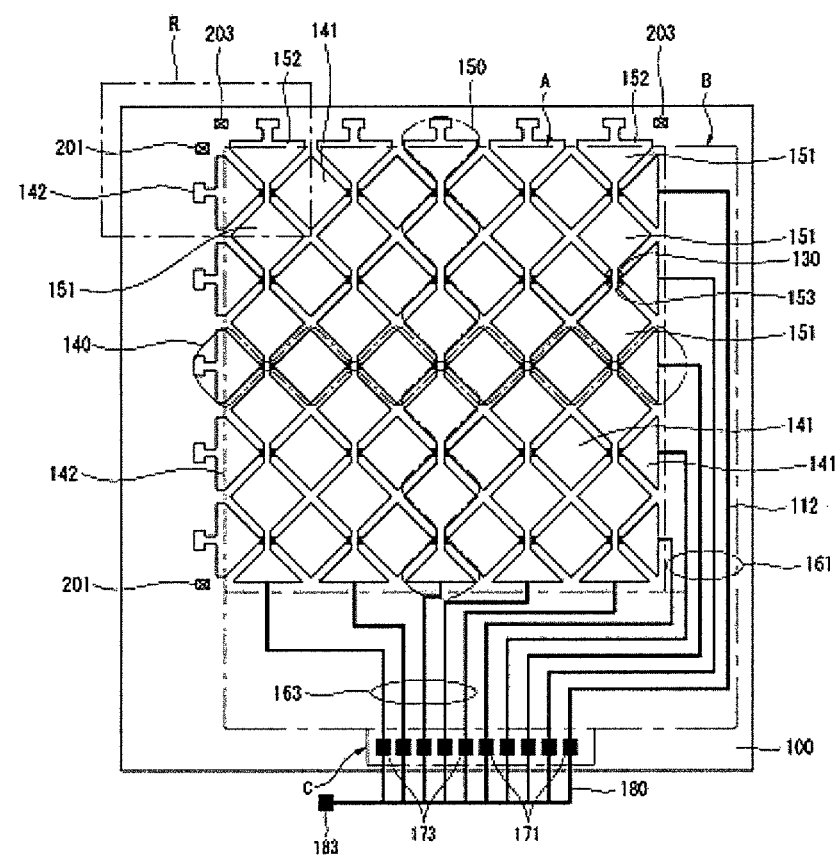
FIG. 2 is a plan view of a touch screen panel according to an example embodiment of the invention.
Figure 3:
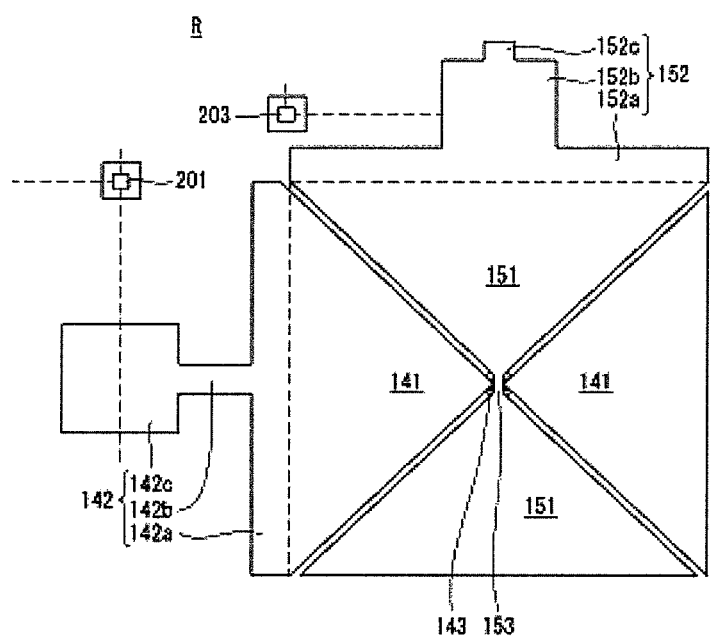
FIG. 3 is an enlarged plan view of a portion R of the touch screen panel shown in FIG. 2.

FIG. 2 is a plan view of a touch screen panel according to an example embodiment of the invention. FIG. 3 is an enlarged plan view of a portion R of the touch screen panel shown in FIG. 2.

As shown in FIGS. 2 and 3, a touch screen panel according to an example embodiment of the invention includes a rectangular electrode forming part A formed on a substrate, a routing wire forming part B formed on the substrate outside the electrode forming part A, and a pad forming part C formed on one side of the routing wire forming part B.

The electrode forming part A includes a plurality of first electrode serials 140 arranged in parallel in a first direction (for example, X-axis direction) and a plurality of second electrode serials 150 arranged in parallel in a second direction (for example, Y-axis direction) crossing over the first direction. Each of the first electrode serials 140 includes a plurality of first electrode patterns 141 having a triangular, rectangular, diamond, or polygonal shape and a plurality of first connecting patterns (not shown) for connecting the first electrode patterns 141. Each of the second electrode serials 150 includes a plurality of second electrode patterns 151 having a triangular, rectangular, diamond, or polygonal shape and a plurality of second connecting patterns 153 for connecting the second electrode patterns 151. In the electrode forming part A, an insulation pattern 130 for electrically insulating the first electrode serial 140 and the second electrode serial 150 is formed at each of intersections of the first electrode serials 140 and the second electrode serials 150. In the embodiment of the invention, the first connecting patterns are formed separately from the first electrode patterns 141, and the second connecting patterns 153 are integrally formed with the second electrode patterns 151. In this way, the adjacent first electrode patterns 141 are separated from each other, but connected to each other by the first connecting patterns arranged in the first direction, thereby forming first channels in a row direction. Moreover, the adjacent second electrode patterns 151 are integrally formed with the second connecting patterns 153 and connected in the second direction, thereby forming second channels in a column direction intersecting the first channel.

The routing wire forming part B formed outside the electrode forming part A includes a plurality of first routing wires 161 respectively connected to the plurality of first electrode serials 140 and a plurality of second routing wires 163 respectively connected to the plurality of second electrode serials 150. Further, the plurality of first routing wires 161 are formed along a first side of the electrode forming part A, and the plurality of second routing wires 163 are formed along a second side contacting the first side of the electrode forming part A.

The pad forming part C includes a plurality of first pads 171 respectively connected to the plurality of first electrode serials 140 through the plurality of first routing wires 161 and a plurality of second pads 173 respectively connected to the plurality of second electrode serials 150 through the plurality of second routing wires 163.

Each of the first pad 171 and the second pad 173 includes a shorting bar 180 for shorting the first and second pads 171 and 173. A shorting pad 183 is connected to ends of the shorting bars 180. The embodiment of the invention describes the first and second pads 171 and 173 each including the shorting bars 180, and the shorting pad 183 connected to ends of the shorting bars 180. Other configurations may be used for the first and second pads 171 and 173. For example, the shorting pad 183 may be formed on each of the first and second pads 171 and 173 without the shorting bar 180.

In the touch screen panel according to the embodiment of the invention, a plurality of first extension patterns 142 are formed at a third side opposite the first side of the electrode forming part A and extend to the outside of the electrode forming part A. Further, a plurality of second extension patterns 152 are formed at a fourth side opposite the second side of the electrode forming part A and extend to the outside of the electrode forming part A.

Each of the first extension patterns 142 includes a first extension portion 142a extending with the same width as the first electrode pattern 141, a second extension portion 142b, which has a width less than a width of the first extension portion 142a and extends from the first extension portion 142a to the outside of the electrode forming part A, and a third extension portion 142c, which has a width greater than the width of the second extension portion 142b and less than the width of the first extension portion 142a and extends from the second extension portion 142b to the outside of the electrode forming part A. Further, each of the second extension patterns 152 includes a first extension portion 152a extending with the same width as the second electrode pattern 151, a second extension portion 152b, which has a width less than a width of the first extension portion 152a and extends from the first extension portion 152a to the outside of the electrode forming part A, and a third extension portion 152c, which has a width less than the width of the second extension portion 152b and extends from the second extension portion 152b to the outside of the electrode forming part A.

In the embodiment of the invention, the first extension pattern 142 includes the first to third extension portions 142a, 142b, and 142c, and the second extension pattern 152 includes the first to third extension portions 152a, 152b, and 152c. Other configurations may be used for the first and second extension patterns 142 and 152. For example, each of the first and second extension patterns 142 and 152 may include at least one of the three extensions. In this case, each of the first and second extension patterns 142 and 152 have to have a sufficient resistance (for example, resistance of about several kΩ), so that they can eliminate static electricity when the static electricity is generated from the outside of the touch screen panel or the static electricity is generated inside the touch screen panel.

The first extension patterns 142 and the second extension patterns 152 may have other shapes in addition to the shape shown in FIGS. 2 and 3. For example, the first extension patterns 142 and the second extension patterns 152 may have one or a combination of at least two of a circle shape, an oval shape, a triangle shape, a rectangle shape, a diamond shape, and a polygon shape.

When the first and second extension patterns 142 and 152 are formed of a transparent conductive material such as ITO (indium tin oxide), IZO (indium zinc oxide), or GZO (gallium-doped zinc oxide), it is convenient that the first and second electrode patterns 141 and 151 may be formed through one process. Other structures and other materials may be used for the first and second extension patterns 142 and 152. Each of the first and second extension patterns 142 and 152 may have a multi-layered structure including a lower layer formed of a metal material such as Al, AlNd, Mo, MoTi, Cu, CuOx, and Cr and an upper layer formed of a transparent conductive material such as ITO and IZO.

First alignment keys 201 are spaced apart from each of the two first extension patterns 142 formed at both ends of the third side of the electrode forming part A at a predetermined distance. Further, second alignment keys 203 are spaced apart from each of the two second extension patterns 152 formed at both ends of the fourth side of the electrode forming part A at a predetermined distance. As shown in FIG. 3, it is preferable that the first alignment keys 201 are formed on a straight line connecting the first extension patterns 142, and the second alignment keys 203 are formed on a straight line connecting the second extension patterns 152.

Figure 4A:
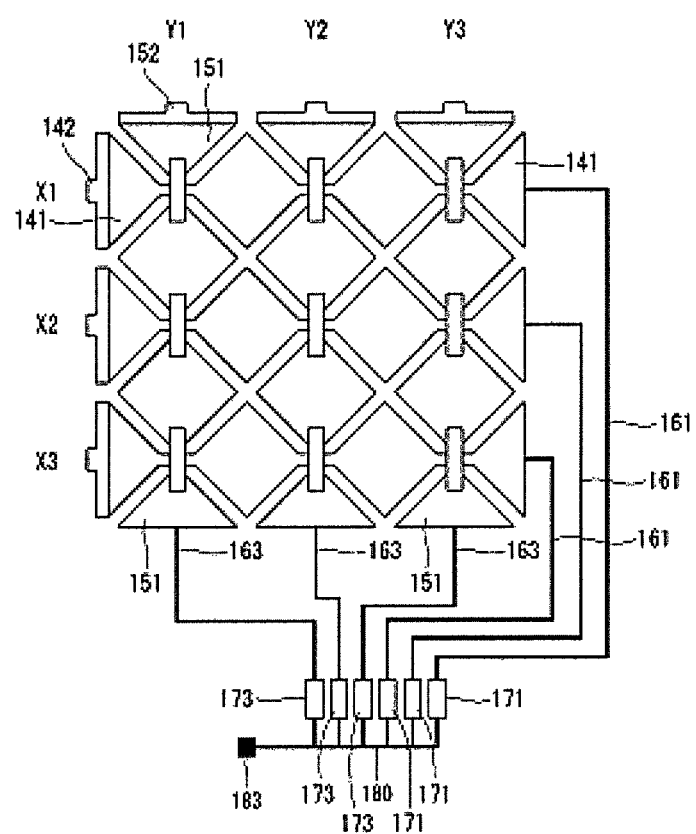
FIG. 4A illustrates a channel open test of a touch screen panel according to an example embodiment of the invention.

A channel open test and a channel short test of the touch screen panel according to the example embodiment of the invention are described below with reference to FIGS. 4A and 4B. FIG. 4A illustrates a channel open test of the touch screen panel according to the example embodiment of the invention, and FIG. 4B illustrates a channel short test of the touch screen panel according to the example embodiment of the invention.

Referring to FIG. 4A, in the channel open test of the touch screen panel, a signal input pin (not shown) of a jig contacts the first extension pattern 142 forming a first channel X1 of the X-axis direction so that a test signal is input to the first channel X1 via the signal input pin. Also, a signal receiving pin (not shown) of the jig is connected to the shorting pad 183 to receive an output signal from the shorting pad 183. In this instance, when the output signal is received, the first channel X1 of the X-axis direction is decided as a normal state. When the output signal is not received, the first channel X1 of the X-axis direction is shorted and is decided as an abnormal state. Next, a second channel X2 and a third channel X3 of the X-axis direction are sequentially tested in the same manner as the first channel X1. Further, channels Y1, Y2, and Y3 of the Y-axis direction are sequentially tested in the same manner as the channels X1, X2, and X3 of the X-axis direction. In this way, because the signal input pin and the signal receiving pin do not need to alternately contact each of the first and second pads, the channel open test of the touch screen panel according to the embodiment of the invention may be more rapidly conducted.

Figure 4B:
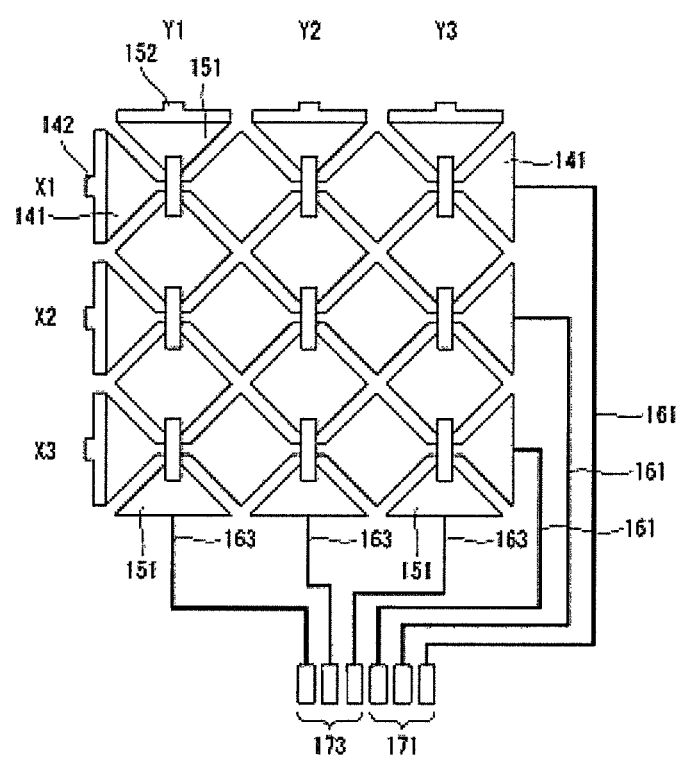
FIG. 4B illustrates a channel short test of a touch screen panel according to an example embodiment of the invention.

Referring to FIG. 4B, the shorting bar 180 and the shorting pad 183 used in the channel open test are omitted in the channel short test of the touch screen panel. In the channel short test of the touch screen panel, a resistance between the adjacent lines needs to be measured. The adjacent first and second channels X1 and X2 of the X-axis direction contact pins of the jig, and resistances of the first and second channels X1 and X2 are measured. Further, the adjacent second and third channels X2 and X3 of the X-axis direction contact pins, and resistances of the second and third channels X2 and X3 are measured. In other words, resistances of the adjacent channels of the X-axis direction are sequentially measured, and resistances of the adjacent channels of the Y-axis direction are sequentially measured in the same manner as the channels of the X-axis direction. Further, in the similar manner, the channels of the X-axis direction respectively correspond to the channels of the Y-axis direction, and resistances of the channels of the X-axis direction and the channels of the Y-axis direction are sequentially measured. When a resistance out of a reference resistance range exists in the resistances thus measured, a part having the resistance out of the reference resistance range is shorted and thus is decided as a bad part. Accordingly, the channel short test of the touch screen panel according to the embodiment of the invention efficiently measures the resistances of the adjacent channels to thereby accurately find the bad part. Hence, the result of the channel short test with the high precision may be obtained.

As described above, in the touch screen panel according to the embodiment of the invention, because the first and second extension patterns 142 and 152 having the sufficient resistance (for example, resistance of about several kΩ) extend from the first and second electrode patterns 141 and 151, the first and second extension patterns 142 and 152 can eliminate static electricity even if the static electricity is generated from the outside of the touch screen panel or the static electricity is generated inside the touch screen panel. Thus, a damage of the touch screen panel according to the embodiment of the invention resulting from the static electricity may be prevented.

Furthermore, because the first and second extension patterns 142 and 152 are formed along the third and fourth sides of the electrode forming part A in which the first and second routing wires 161 and 163 are not formed, the static electricity may be prevented and terminals for the channel open and short tests may be secured. Thus, the signal input pin and the signal receiving pin do not need to alternately contact each of the first and second pads in the touch screen panel according to the embodiment of the invention. As a result, the channel open and short tests may be more rapidly conducted, and the productivity may increase.

Furthermore, because the first alignment keys 201 are formed at each of both ends of the third side of the electrode forming part A and the second alignment keys 203 are formed at each of both ends of the fourth side of the electrode forming part A, the signal input pin and the signal receiving pin of the jig may be accurately positioned when the channel open and short tests are conducted using the jig. Hence, the accurate test result may be obtained.

The touch screen panel according to the embodiment of the invention may be applied to a display device such as a liquid crystal display (LCD), a field emission display (FED), a plasma display panel (PDP), an electroluminescence device (EL), and an electrophoretic display (EPD). In this instance, the substrate of the touch screen panel according to the embodiment of the invention may be used as a substrate of the display device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch screen panel comprising:
a substrate;
an electrode forming part formed on the substrate, the electrode forming part including a plurality of first electrode serials arranged in parallel in a first direction and a plurality of second electrode serials arranged in parallel in a second direction to cross over the plurality of first electrode serials;
a routing wire forming part formed on the substrate outside the electrode fanning part, the routing wire forming part including a plurality of first routing wires respectively connected to the plurality of first electrode serials and a plurality of second routing wires respectively connected to the plurality of second electrode serials; and
an insulation layer configured to insulate each of the plurality of first electrode serials from each of the plurality of second electrode serials at each of the intersections of each of the plurality of first electrode serials and each of the plurality of second electrode serials,
wherein the plurality of first routing wires are formed along a first side of the electrode forming part, and the plurality of second routing wires are formed along a second side of the electrode forming part,
wherein each of the plurality of first electrode serials includes a plurality of first electrode patterns, that are electrically connected to one another, and each of the plurality of second electrode serials includes a plurality of second electrode patterns, that are electrically connected to one another,
wherein each of the plurality of first electrode patterns formed at a third side of the electrode forming part includes a first extension pattern extending to the outside of the electrode forming part, and the first extension pattern is formed with a same material as the each of the plurality of first electrode patterns, and
each of the plurality of second electrode patterns formed at a fourth side of the electrode forming part includes a second extension pattern extending to the outside of the electrode forming part, and the second extension pattern is formed with a same material as the each of the plurality of second electrode patterns.

2. The touch screen panel of claim 1, wherein the first and second sides of the electrode forming part are adjacent to each other and connected to each other,
the third and fourth sides of the electrode forming part are adjacent to each other and connected to each other, and
the first and third sides of the electrode forming part are face to face.

3. The touch screen panel of claim 1, wherein the first extension pattern includes a first extension portion extending with the same width as the first electrode pattern, a second extension portion, which has a width less than a width of the first extension portion and extends from the first extension portion to the outside of the electrode forming part, and a third extension portion, which has a width greater than the width of the second extension portion and less than the width of the first extension portion and extends from the second extension portion to the outside of the electrode forming part.

4. The touch screen panel of claim 3, wherein the second extension pattern includes a first extension portion extending with the same width as the second electrode pattern, a second extension portion, which has a width less than a width of the first extension portion and extends from the first extension portion to the outside of the electrode forming part, and a third extension portion, which has a width less than the width of the second extension portion and extends from the second extension to the outside of the electrode forming part.

5. The touch screen panel of claim 1, further comprising:
a plurality of first pads respectively connected to the plurality of first routing wires; and
a plurality of second pads respectively connected to the plurality of second routing wires.

6. The touch screen panel of claim 5, further comprising:
a shorting bar configured to short the plurality of first pads and the plurality of second pads; and
a shorting pad connected to the shorting bar.

7. The touch screen panel of claim 2, further comprising a pair of first alignment keys, which are spaced apart from the first extension patterns formed at both ends of the third side of the electrode forming part at a predetermined distance, respectively.

8. The touch screen panel of claim 7, further comprising a pair of second alignment keys, which are spaced apart from the second extension patterns formed at both ends of the fourth side of the electrode forming part at a predetermined distance, respectively.

9. The touch screen panel of claim 1, wherein the first extension patterns and the second extension patterns have at least one of a circle shape, an oval shape, a triangle shape, a rectangle shape, a diamond shape, and a polygon shape.

* * * * *